(12) United States Patent
Ahn et al.

(10) Patent No.: US 8,329,568 B1
(45) Date of Patent: Dec. 11, 2012

(54) SEMICONDUCTOR DEVICE AND METHOD FOR MAKING THE SAME

(75) Inventors: Jae-Gyung Ahn, Pleasanton, CA (US); Myongseob Kim, Pleasanton, CA (US); Ping-Chin Yeh, San Jose, CA (US); Zhiyuan Wu, San Jose, CA (US); John Cooksey, Brentwood, CA (US)

(73) Assignee: Xilinx, Inc., San Jose, CA (US)

( * ) Notice: Subject to any disclaimer, the term of this patent is extended or adjusted under 35 U.S.C. 154(b) by 255 days.

(21) Appl. No.: 12/772,969

(22) Filed: May 3, 2010

(51) Int. Cl.
*H01L 21/425* (2006.01)

(52) U.S. Cl. ............... 438/529; 257/274; 257/E21.446; 257/E29.266

(58) Field of Classification Search ............ 438/189, 438/188, 529; 257/E21.446, E27.148, E29.266, 257/274
See application file for complete search history.

(56) References Cited

U.S. PATENT DOCUMENTS

| | | | |
|---|---|---|---|
| 6,388,315 B1 | 5/2002 | Clark et al. | |
| 2003/0107069 A1* | 6/2003 | Takao | 257/296 |
| 2005/0260841 A1* | 11/2005 | Lu et al. | 438/592 |
| 2005/0285159 A1* | 12/2005 | Chan et al. | 257/288 |
| 2006/0081947 A1* | 4/2006 | Mimura | 257/407 |
| 2007/0096144 A1* | 5/2007 | Kapoor | 257/134 |
| 2008/0023773 A1* | 1/2008 | Shimamune et al. | 257/377 |
| 2009/0014805 A1 | 1/2009 | Chidambaram et al. | |

OTHER PUBLICATIONS

Eneman, G. et al.; "Layout Impact on the Performance of a Locally Strained PMOSFET", 2005 Symposium on VLSI Technology Digest of Technical Papers, 2005, Jun. 14-16, 2005; pp. 22-23, Kyoto, Japan.
Lo, Cheng-Yao et al., "A test structure to verify the robustness of silicided N+/P+ interface", Proceeding of IEEE 2004 Int. Conference on Microelectronic Test Structures, vol. 17, Mar. 22-25, 2004, pp. 169-172.
Tamura, N. et al., "Embedded Silicon Germanium (eSiGe) technologies for 45nm nodes and beyond", Junction Technology, 2008, IWjT '08, 2008 8th International workshop on Extended Abstracts, May 15-16, 2008, pp. 73-77, Shanghai.
Ota, K. et al., "Scalable eSiGe S/D technology with less layout dependence for 45-nm generation", 2006 Symposium on VLSI Technology Digest of Technical Papers, Oct. 2, 2006, pp. 64-65, Honolulu, HI.
Joshi, V. et al., "Stress Aware Layout Optimization", Proc. ISPD 2008, Electrical Issues and Clock Network Design in Physical Synthesis, Apr. 13-16, 2008, pp. 1-20, Portland, Oregon.

* cited by examiner

*Primary Examiner* — Caridad Everhart
(74) *Attorney, Agent, or Firm* — LeRoy D. Maunu

(57) ABSTRACT

In one embodiment of the present invention, a field effect transistor device is provided. The field effect transistor device comprises an active area, including a first semiconductor material of a first conductivity type. A channel region is included within the active area. A gate region overlays the channel region, and the first source/drain region and the second source/drain region are embedded in the active area and spaced from each other by the channel region. The first source/drain region and the second source/drain region each include a second semiconductor material of a second conductivity type opposite of the first conductivity type. A well-tap region is embedded in the active area and spaced from the first source/drain region by the channel region and the second source/drain region. The well-tap region includes the second semiconductor material of the first conductivity type. The first source/drain region and the second source/drain region and the well-tap region are epitaxial deposits.

20 Claims, 6 Drawing Sheets

SEMICONDUCTOR DEVICE AND METHOD FOR MAKING THE SAME

FIELD OF THE INVENTION

An embodiment of the present invention generally relates to a semiconductor structure and method of manufacture.

BACKGROUND

As semiconductor manufacturers seek to increase the speed of microelectronic devices, strained silicon and crystal lattice engineering are increasingly relied upon to adjust the properties of semiconductor materials. Strained silicon is a layer of silicon in which the silicon atoms of a crystal lattice are stretched or compressed beyond their normal inter-atomic distance. This can be accomplished by aligning the atoms in a silicon layer with atoms of another material having a crystalline structure with atomic spacing larger than or smaller than that of silicon. For example, if silicon atoms are aligned with a silicon-germanium structure, where the atoms are arranged a little farther apart than are silicon atoms alone, the links between the silicon atoms become stretched. Moving these silicon atoms farther apart reduces the atomic forces that interfere with the movement of electrons through a semiconductor and thereby provides better mobility of electron carriers. On the other hand, reducing the distance between atoms has the effect of reducing atomic forces that interfere with the movement of holes. By stressing semiconductor materials to achieve the desired mobility, semiconductor performance can be improved.

The crystal lattice of a semiconductor region may be stretched or may be compressed to adjust electron and hole mobility. This distinction is sometimes made using the term stress to refer to a compressed lattice structure and strain to refer to a stretched lattice structure. The embodiments and examples contained herein are described using the terms compressive stress to refer to a compressed lattice structure and tensile stress to refer to a stretched lattice structure. Stress and strain are both used to generally refer to both compressive and tensile stresses, and such terms are used interchangeably herein.

Silicon can be stressed by several methods. One approach involves the use of a capping layer to induce stress in silicon of an adjacent lower layer. Depending on the material used for the capping layer, the magnitude and type of stress induced (tensile or compressive) may be adjusted by modulating the deposition conditions, such as temperature. Standard lithography patterning techniques may be used to selectively deposit a capping layer over a target region to induce stress.

Another approach involves epitaxially growing a silicon layer over a substrate layer of silicon-germanium. As silicon atoms bond with silicon-germanium atoms, the silicon is formed to match the lattice structure of the silicon germanium layer. In this manner, the lattice structure of the silicon is constructed in a stretched form.

Another approach is to form embedded stressors, such as source and drain regions of a MOSFET, in a semiconductor to induce stress in the region between the embedded stressors. The magnitude and type of stress induced may be adjusted by selecting various materials for the embedded stressors and adjusting the epitaxial deposit conditions.

SUMMARY

In one embodiment of the present invention, a field effect transistor device is provided. The field effect transistor device comprises an active area, including a first semiconductor material of a first conductivity type. A channel region is included within the active area. A gate region overlays the channel region and first and second source/drain regions are embedded in the active area and spaced from each other by the channel region. The first and second source/drain regions each include a second semiconductor material of a second conductivity type opposite of the first conductivity type. A well-tap region is embedded in the active area and spaced from the first source/drain region by the channel region and by the second source/drain region. The well-tap region includes the second semiconductor material of the first conductivity type. The first and second source/drain regions and the well-tap region are epitaxial deposits.

In yet another embodiment of the present invention, a method for manufacture of a silicon semiconductor device is provided. A dielectric layer is formed on a substrate of a first semiconductor material of a first conductivity type. A gate is formed on the dielectric layer. A second semiconductor material of a second conductivity type is formed in first and second source/drain regions. The second semiconductor material of the first conductivity type is formed in a well-tap channel.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

In semiconductor devices, leakage of current can occur from the source and drain regions of a transistor into the semiconductor substrate. Through a process known as carrier diffusion, small currents can leak between the source and drain through the substrate channel while the transistor is in the off state. As transistor gate dimensions are decreased to improve latching speed, carriers diffuse from source to drain regions more easily and leakage increases exponentially. As source voltages are reduced to increase power efficiency, leakage contributes to a larger portion of the overall power consumption of a transistor.

To avoid the exponential growth of leakage current that results from decreasing gate dimensions, strained silicon can be used to increase carrier mobility and semiconductor performance. Epitaxial deposition of stressor materials in source and drain regions of a transistor semiconductor can be used to induce stress in the channel region and improve performance. Moving these silicon atoms farther apart or closer together reduces the atomic forces that interfere with the carrier mobility electrons and holes. By stressing semiconductor materials to achieve the desired mobility, semiconductor performance can be improved.

A well tap may be required to provide stable bias of a well. Without stable bias, well potential can be closed to drain because of the leakage current from the drain to the well. This results in increased injection of carriers from the source to the well and a significant increase of channel leakage in the end. Because the well-tap is of a conductivity type opposite that of the source and drain regions, the stressor used in embedded source and drain regions may not be applied to well-tap regions. This may result in significant reduction to the stressing of nearby MOSFETs and performance could be a strong function of well-tap location.

One or more embodiments of the present invention provide a semiconductor transistor with a stressing well-tap. The well-tap includes stressors to increase carrier mobility in the channel area near the well-tap. In this manner, channel performance can be increased through stressing without increasing leakage.

Figure 1:
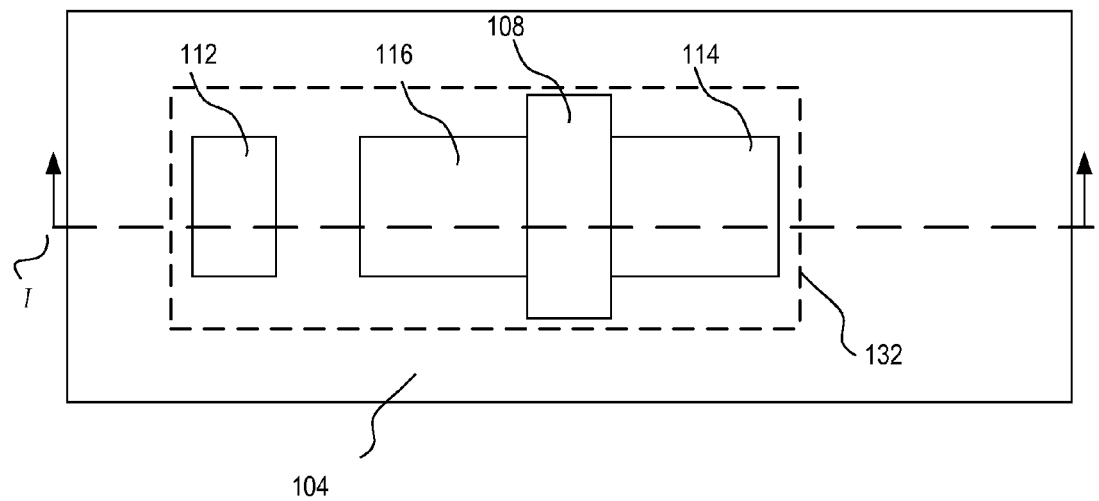
FIG. 1 shows a top view of a p-type MOSFET (PMOS transistor) with stressing materials placed in source, drain, and well-tap regions in accordance with an embodiment of the invention.
Figure 2:
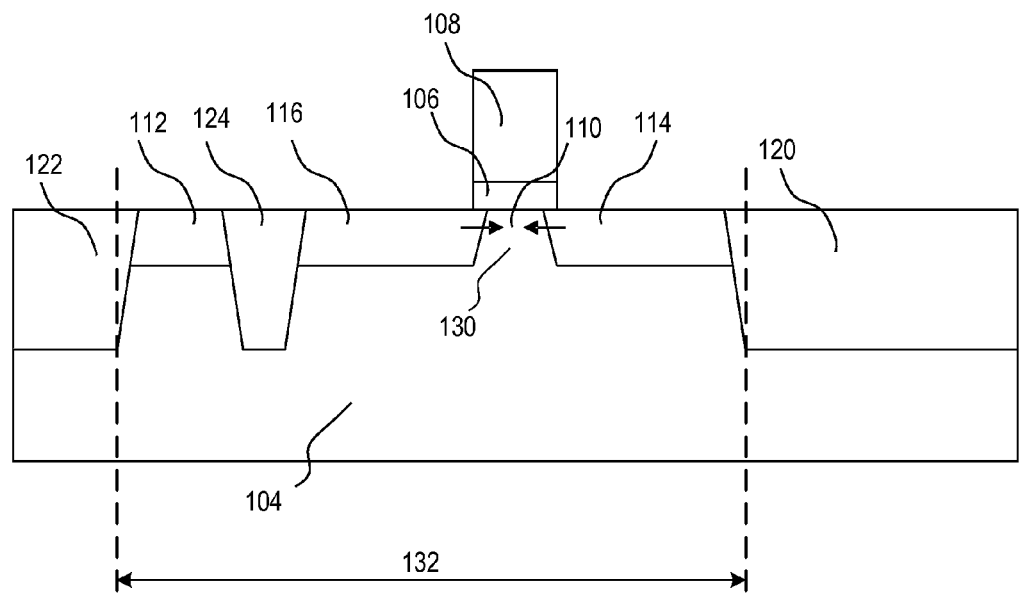
FIG. 2 shows a cross-section of the PMOS transistor shown in FIG. 1.

FIGS. 1 and 2 respectfully show a top view and cross-section of a p-type MOSFET (PMOS transistor) with stressing materials placed in source, drain, and well-tap regions in accordance with an embodiment of the invention. The active area 132 of the PMOS transistor includes a source 116, a drain 114, and a well-tap 112 formed in an n-type substrate 104. The PMOS transistor is isolated by isolation regions 120 and 122. The well-tap 112 is separated from source region 116 by isolation region 124.

The source 116 and the drain 114 are composed of a heavily doped p-type stressor material. The well-tap 112 is composed of a heavily doped n-type stressor material. The source 116 is separated from the drain 114 in the substrate 104, forming a channel region 130. A dielectric layer 106 is formed on substrate 104 between source 116 and drain 114 regions. A gate 108 is formed on top of the dielectric layer 106. When a voltage is applied to the gate 108, electrons may travel from the source region 116 to the drain region 114 through the carrier channel formed under gate 108.

The well-tap 112 is a heavily doped n-type stressor material. The well-tap 112 sets the potential of the n-type substrate 104 and prevents leakage from the source region 116 and the drain region 114 into the n-type substrate 104. The stressing materials in the source 116, drain 114, and well-tap 112 regions cause stress in the direction of 110 in the semiconductor lattice of the substrate 104 and increase carrier mobility. As a result of the stressing provided by well-tap 112, the stress of the neighboring diffusion region is increased.

In one embodiment of the invention, silicon-germanium (SiGe) is used as the stressing material to form source, drain, and well-tap regions of a PMOS transistor. The stressed well-tap region provides additional stress to the PMOS transistor channel and neighboring diffusion regions. It is desirable for the source and drain regions to be formed from the same semiconductor material so that the channel region is uniformly stressed to a uniform lattice structure. If materials with different lattice structures are used, the channel region will be stressed to different lattices and different points resulting in defects from lattice mismatch within the channel region. When the same semiconductor material is used, well-tap, source, and drain regions may be deposited at the same time during manufacturing.

Figure 3:
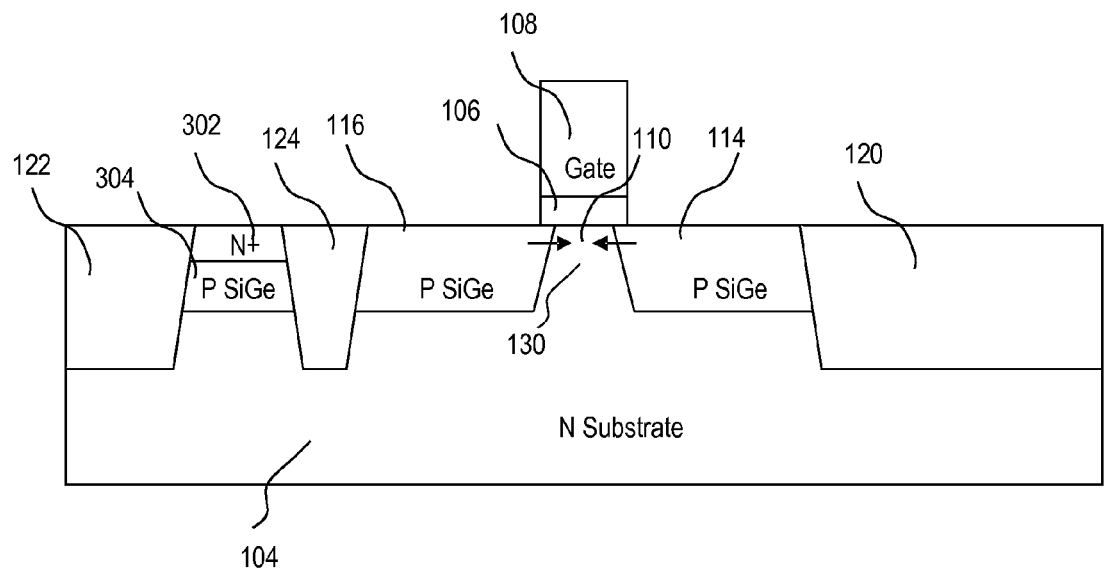
FIG. 3 shows the PMOS transistor of FIG. 2 with a well-tap having an underlying p-type silicon germanium stressor.

If p-type silicon-germanium is used to introduce the stress, the well-tap may form a semiconductor structure that does not function properly. FIG. 3 shows the PMOS transistor of FIG. 2 with a well-tap having an underlying p-type silicon germanium stressor. The well-tap includes a highly doped n-type region 302 and an underlying p-type silicon-germanium stressing region 304. The resulting well-tap forms an n+/p/n junction, which may function as a transistor and prevent the well-tap from biasing substrate region 104. To avoid this result, in one embodiment of the present invention, the well-tap is formed with underlying stressor formed of n-type silicon germanium.

Figure 4:
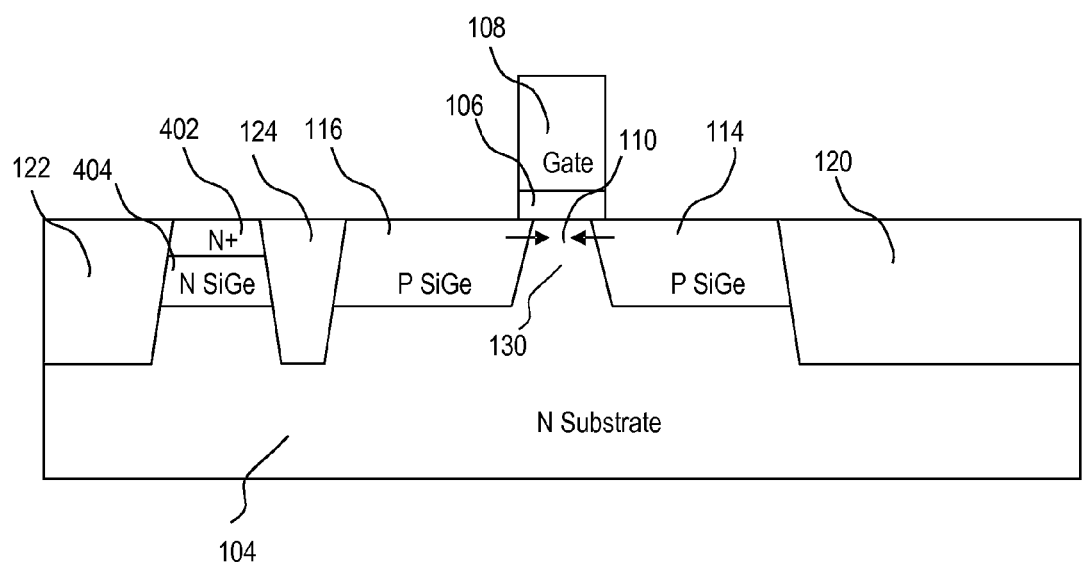
FIG. 4 shows the PMOS transistor of FIG. 2 with a well-tap having an underlying n-type silicon germanium stressor.

FIG. 4 shows the PMOS transistor of FIG. 3 with a well-tap formed having an underlying n-type silicon germanium stressor. The well-tap includes a highly doped n-type region 402 and an underlying n-type silicon-germanium stressor 404. In this implementation, the well-tap forms an n+/n/n junction with substrate 104.

In other embodiments, the well-tap may be formed wholly of highly doped n+ silicon-germanium. In some implementations, the well-tap region may also include gradient doping.

Figure 5:
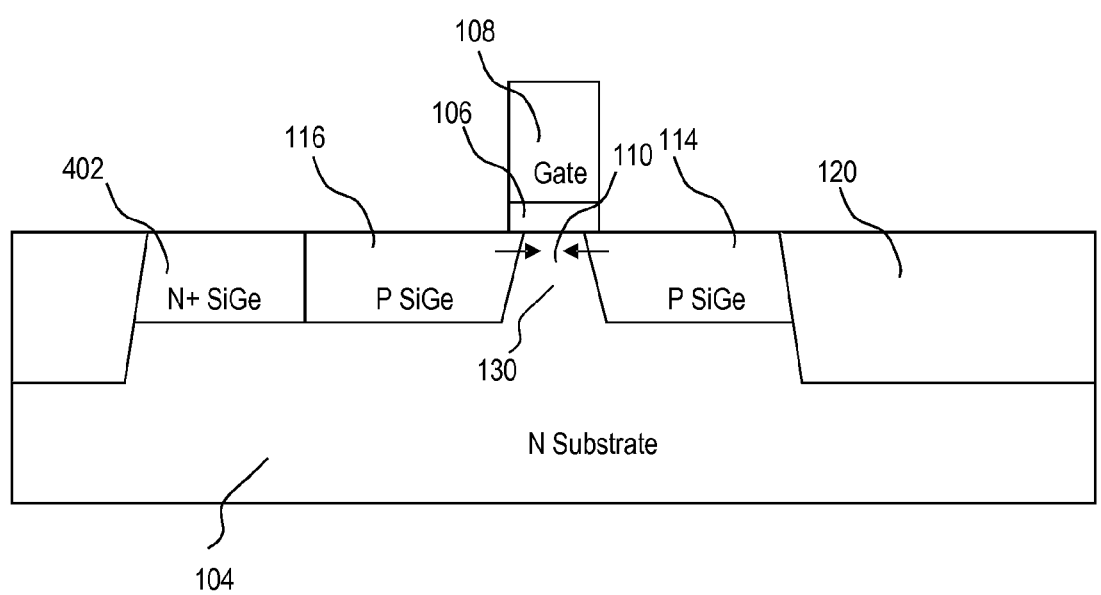
FIG. 5 shows the PMOS transistor of FIG. 2 with a well-tap having an underlying n-type silicon germanium stressor abutting the source region.

In one embodiment, the well-tap may be formed abutting to the source region. FIG. 5 shows the PMOS transistor of FIG. 2 with a well-tap 402 formed abutting the source region 116. In this example, well-tap 402 is formed from high n+ doped silicon germanium. Since well-tap 402 and source 116 have a silicon-germanium based lattices, performance degradation prevalent in abutting well-tap configurations can be avoided.

Although the various embodiments hereinabove are described in the context of a PMOS transistor, the process can be used to fabricate other types of transistor devices such as an n-type MOSFET (NMOS transistor), a Complementary MOSFET (CMOS transistor), as well as other types of transistors known in the art.

When silicon is strained to increase transistor performance, one key consideration is that PMOS and NMOS transistors respond differently to different types of strain. PMOS transistor performance is increased by applying compressive stress to the channel, whereas NMOS transistor performance is increased by applying tensile stress. If compressive stress is applied to p-type substrate, or tensile stress is applied to an n-type substrate, performance is decreased.

In the context of an NMOS transistor, silicon-carbide (SiC) can be used in the source, drain, and well-tap regions to apply tensile stress and increase transistor performance. In the NMOS application, the well-tap region is p-doped to form a P+/P or P+/P/P junction with the substrate.

In some embodiments of the invention, complementary NMOS and PMOS transistors are formed in a substrate to create a CMOS transistor. In CMOS transistors, a well-tap may be formed between the source and/or drain regions of the PMOS and NMOS transistors. In such a situation, stressing of the well-tap may be done selectively based on proximity to each of the complementary transistors. For example, a well-tap may be formed in the n-well of the PMOS transistor. If the well-tap is closer to the NMOS, silicon-germanium stressing may degrade performance of the NMOS transistor more than performance of the PMOS transistor is improved. In such a situation, the well-tap may be implemented so that the stressing material is not embedded, which can help to avoid performance degradation of the NMOS transistor.

As discussed above, it is desirable for the source and drain regions to be formed from the same semiconductor material so that source, drain, and well-tap regions can be epitaxially formed concurrently during the manufacturing process. However, the well-tap region must be doped to the conductivity type opposite that of the source and drain regions. In some embodiments, methods are provided for manufacturing a MOSFET having source, drain, and well-tap stressors, in which the source, drain, and well-tap stressors may be formed concurrently.

Embedded stressor materials are generally deposited using a process known as Chemical Vapor Deposition (CVD). In CVD, a semiconductor layer is formed on a substrate from the reaction of vapor phase chemical reactants with the substrate. For manufacturing efficiency, deposits are generally doped at the time of deposition through a process known as in-situ doping. In-situ doping involves the addition of dopant gases such as phosphine and diborane to the reactant gases during CVD deposition.

In the context of a PMOS transistor, source and drain regions are doped with p-type materials. If the well-tap region is deposited and doped at the same time as the source and drain regions, the p-type doped well-tap and N-type substrate will form an NPN structure, as discussed above, which may prevent electrical connection through the well-tap. In order to deposit an opposite-type doped material in the tap region with the conventional in-situ doping process, a second CVD process would be required to form the well-tap region separate from the formation of the source and drain regions. Some embodiments of the present invention form source, drain, and well-tap regions, which are p-doped in-situ, followed by an additional implant step to add n-type doping materials to the well-tap region.

Dopants may be added to the well-tap region through a process known as ion implantation. The well-tap region is bombarded with high-energy ions of the desired dopant type. Implanted dopants are added to compensate for the dopants added during the in-situ doping process. Ion implantation can be used to control the doping of the well region with high accuracy. The well-tap region of a PMOS transistor can be doped to a high n+ doping level during the ion implantation process or may be doped enough to compensate for the in-situ doping to achieve a doping level equal to that of the well. In some embodiments, the ion implantation may be followed by an annealing step to repair lattice disturbances and diffuse the implanted dopants. Ion implantation may not be performed if doping of the silicon germanium during deposition is not high enough to adversely affect performance of the well-tap.

Figure 6:
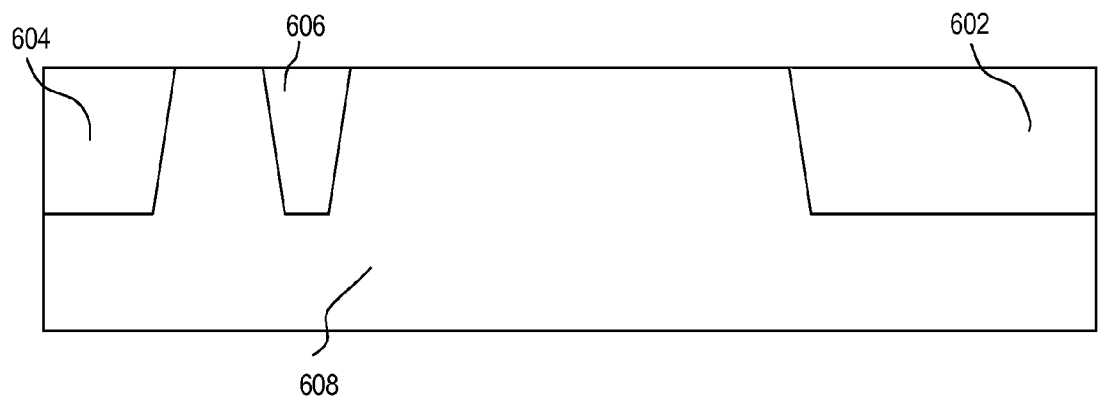
FIG. 6 shows a semiconductor device with isolation regions formed in a semiconductor substrate layer.
Figure 7:
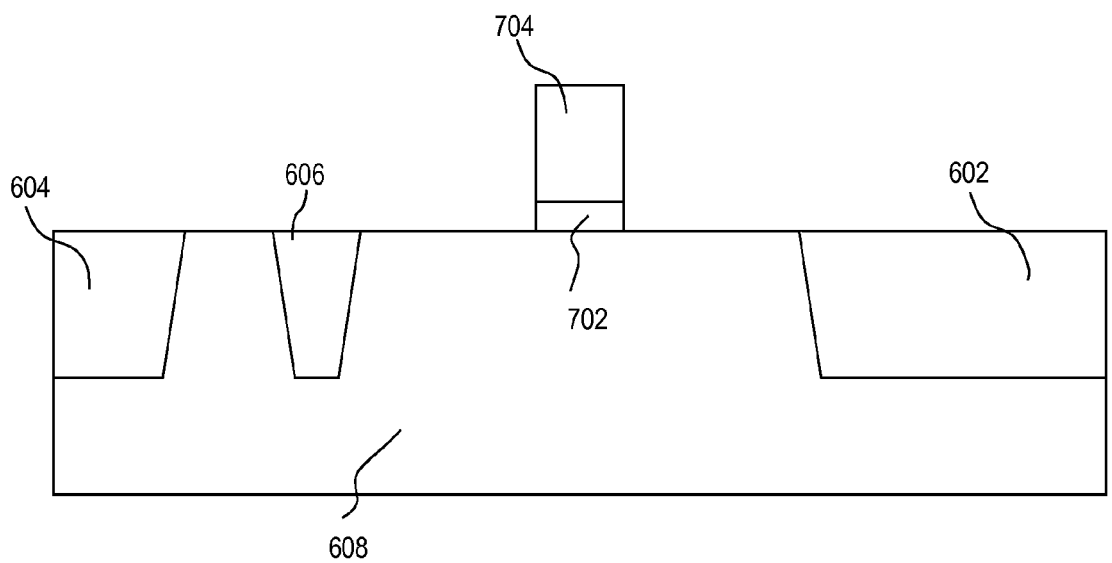
FIG. 7 illustrates the formation of a dielectric layer and a poly-silicon gate on the semiconductor substrate layer of the semiconductor device shown in FIG. 6.

FIGS. 6, 7, 8, 9, 10, and 11 illustrate various steps for manufacturing a semiconductor transistor device in accordance with several embodiments of the present invention. FIG. 6 illustrates the formation of isolation regions 602, 604, and 606 in a semiconductor substrate layer 608. FIG. 7 illustrates the formation of a gate on the semiconductor substrate layer 608. A dielectric layer 702 is first formed on the semiconductor substrate layer 608. A poly-silicon gate 704 is formed on the dielectric layer 702.

Figure 8:
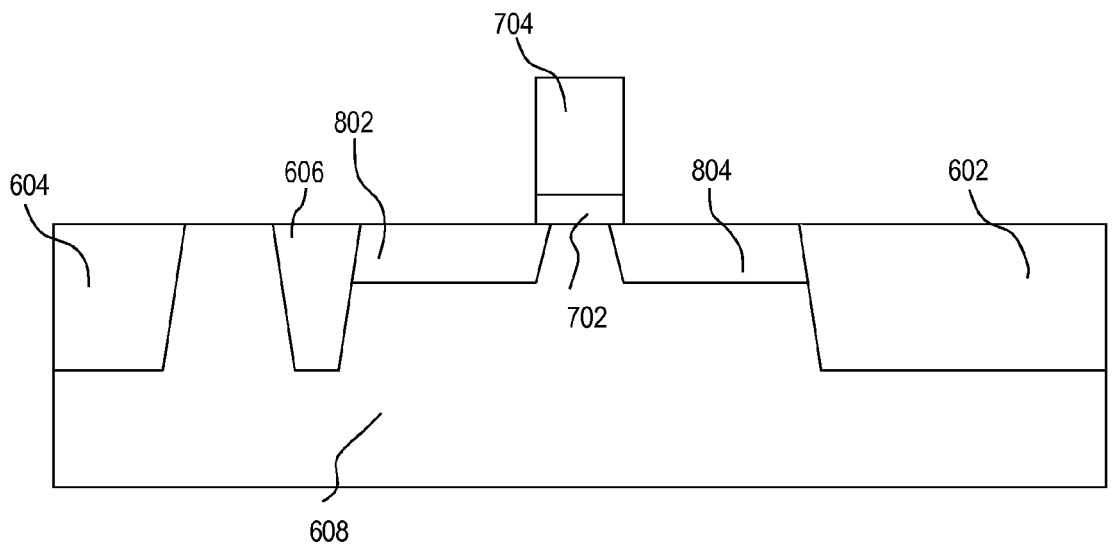
FIG. 8 shows source and drain regions formed in the semiconductor device of FIG. 7.

FIG. 8 shows the semiconductor device of FIG. 7 following formation of source 802 and drain 804 in the semiconductor substrate 608. Stressing semiconductor material, such as SiGe, of a second conductivity type is deposited in the source and drain regions using CVD deposition. Prior to formation of the stressing semiconductor material of the second conductivity type, channels may be formed and cleaned to remove any material generated during the channel formation. In some other embodiments, the stressing semiconductor material may be deposited and epitaxially grown using rapid thermal annealing.

Figure 9:
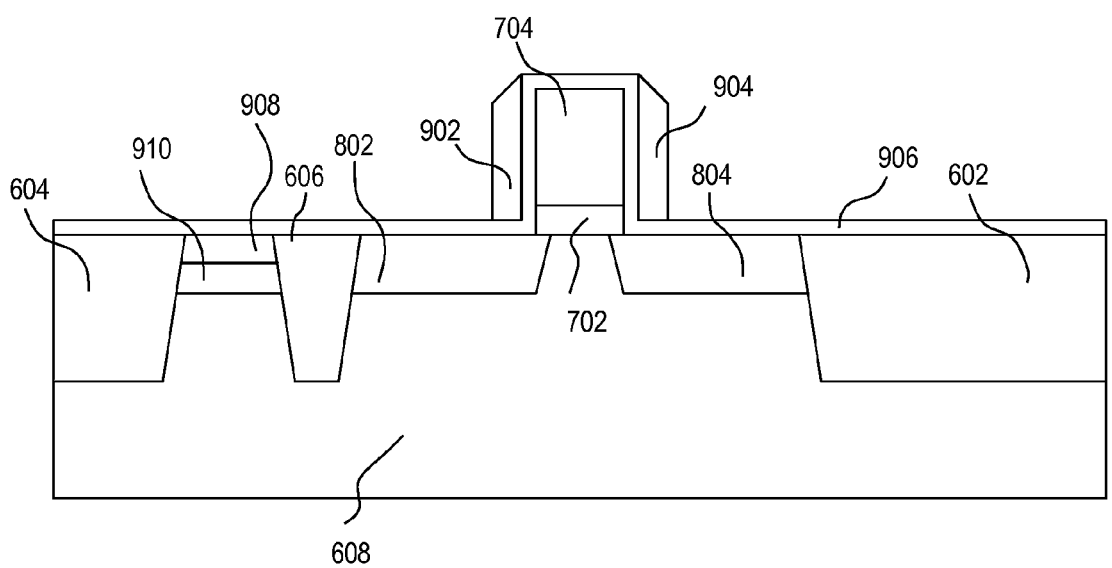
FIG. 9 shows the semiconductor device of FIG. 8 after formation of a well-tap region, an oxide layer, and silicon nitride spacers formed next to the gate.

FIG. 9 illustrates the device of FIG. 8 after formation of a well tap and, oxide layer 906, and silicon nitride spacers 902 and 904 in accordance with some embodiments of the invention. In this example, the well tap includes a highly doped upper portion 908 and a lower stressing portion 910. Stressing semiconductor material is deposited to form the lower stressing portion 910 using CVD deposition. Ion implantation is performed on the semiconductor material of the lower stressing portion 910 to achieve the desired doping concentration. In some embodiments, the ion-implantation may be followed by an annealing step to repair lattice disturbances and diffuse the dopants implanted in the lower stressing portion 910. A highly doped semiconductor material is deposited to form the upper portion 908 on lower stressing portion 910. An oxide layer 906 is formed over the semiconductor device and silicon nitride isolation spacers 902 and 904 are formed over the oxide layer on each side of the gate. In some embodiments, the silicon nitride isolation spacers 902 and 904 may be formed prior to etching of the source 802, drain 804, and well-tap portions 908 and 910 to protect the gate during etching of the channels.

Figure 10:
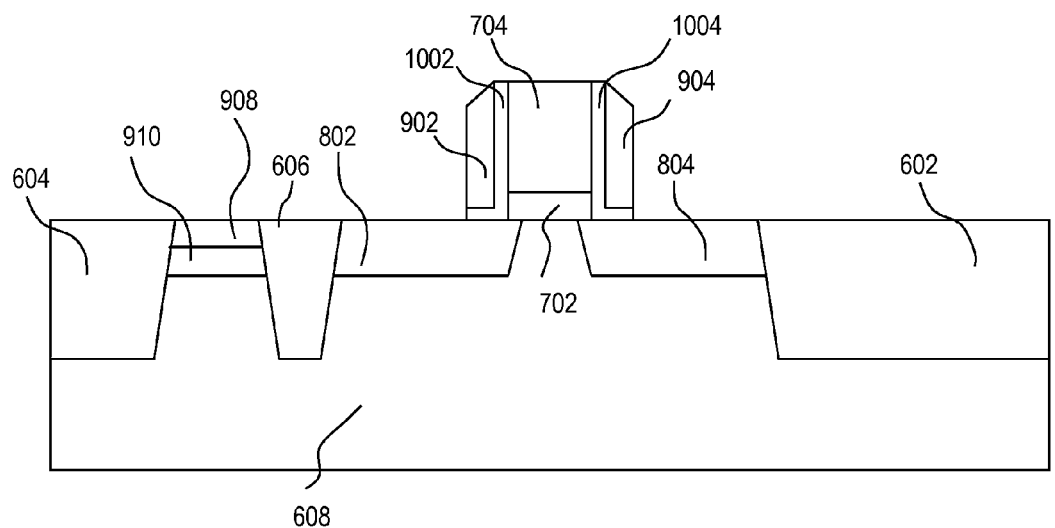
FIG. 10 shows a the semiconductor device of FIG. 9 after removal of the oxide layer.
Figure 11:
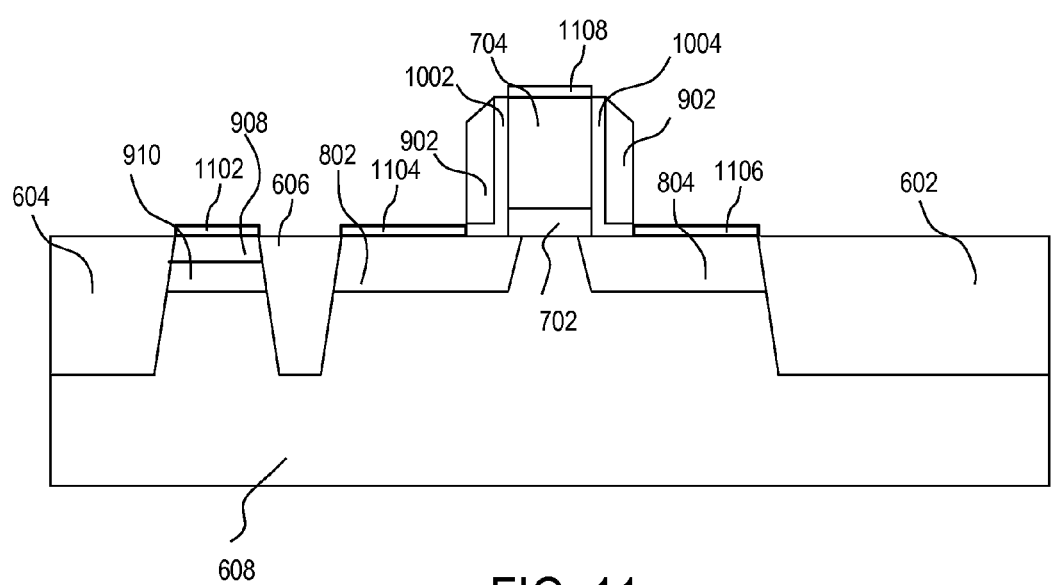
FIG. 11 shows the semiconductor device of FIG. 10 with silicide contacts formed on gate, source, drain, and well-tap regions.

FIG. 10 illustrates the removal of the oxide layer 906 (shown in FIG. 9) in the regions not covered by the silicon nitride isolation spacers 902 and 904. FIG. 11 illustrates the formation of metalized contacts 1102, 1104, 1106, and 1108 on top of the well-tap upper portion 908, source 802, drain 804, and gate 704 regions, respectively.

One or more embodiments of the present invention is thought to be applicable to a variety of semiconductor transistors devices. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A field effect transistor device comprising:
   an active area including a first semiconductor material of a first conductivity type;
   a channel region within the active area;
   a gate region overlaying the channel region;
   a first source/drain region and a second source/drain region embedded in the active area and spaced from each other by the channel region, the first source/drain region and the second source/drain region each include a second semiconductor material of a second conductivity type opposite of the first conductivity type;
   a well-tap region embedded in the active area and spaced from the first source/drain region by the channel region and the second source/drain region, the well-tap region comprising the second semiconductor material of the first conductivity type; and
   wherein the first source/drain region, the second source/drain region, and the well-tap region are epitaxial deposits.

2. The field effect transistor device of claim 1, wherein the second source/drain region and the well-tap region are spaced from each other by a first distance.

3. The field effect transistor device of claim 1, wherein the second semiconductor material of the first conductivity type in the well-tap region has a higher doping concentration than the first semiconductor material of the first conductivity type in the active area.

4. The field effect transistor device of claim 1, further comprising an isolation region embedded in the active region, wherein the well tap region and second source/drain region are spaced from each other by the isolation region.

5. The field effect transistor device of claim 1, wherein the well-tap region is abutted to the second source/drain region.

6. The field effect transistor device of claim 1, wherein the second semiconductor material in the well-tap region contains p-type and n-type dopants.

7. The field effect transistor device of claim 1, wherein:
the first conductivity type is N;
the second conductivity type is P; and
the second semiconductor material is SiGe.

8. The field effect transistor device of claim 7, wherein:
the first semiconductor material and the second semiconductor material have crystal lattices with respective first and second spacings; and
the first spacing is smaller than the second spacing, and a compressive stress is created in the channel region as a result of stressing in the first source/drain region, second source/drain region, and the well-tap region.

9. The field effect transistor device of claim 1, wherein:
the first conductivity type is P;
the second conductivity type is N; and
the second semiconductor material is SiC.

10. The field effect transistor device of claim 9, wherein:
the first semiconductor material and the second semiconductor material have crystal lattices with respective first and second spacings; and
the first spacing is larger than the second spacing, and a tensile stress is created in the channel region and in a portion of the active region located between the second source/drain region and the well-tap region.

11. A method for manufacture of a silicon semiconductor device comprising the steps of:
forming a dielectric layer on a substrate of a first semiconductor material of a first conductivity type;
forming a gate on the dielectric layer;
epitaxially forming a second semiconductor material of a second conductivity type in a first source/drain region and a second source/drain region; and
epitaxially forming the second semiconductor material of the first conductivity type in a well-tap channel.

12. The method of claim 11, further comprising:
forming separate silicide layers on the gate;
forming an embedded semiconductor material in the first source/drain region;
forming the embedded semiconductor material in the second source/drain region; and
forming the embedded semiconductor material in the well-tap region.

13. The method of claim 11, wherein first source/drain region and the second source/drain region are spaced from each other by a channel region under the gate.

14. The method of claim 11, wherein the second semiconductor material of the first conductivity type in the well-tap region has a higher doping concentration than the first semiconductor material of a first conductivity type.

15. The method of claim 11, wherein:
the first conductivity type is N and the second conductivity type is P; and
the second semiconductor material is eSiGe.

16. The method of claim 11, wherein:
the first conductivity type is P and the second conductivity type is N; and
the second semiconductor material is eSiC.

17. The method of claim 11, wherein the second semiconductor material in the first source/drain region, the second source/drain region, and the well-tap region are epitaxially grown using rapid thermal annealing.

18. The method of claim 11, wherein the second semiconductor material in the first source/drain region, the second source/drain region, and the well-tap region are formed using chemical vapor deposition.

19. The method of claim 11, wherein the second semiconductor material is formed in the first source/drain region, the second source/drain region and the well-tap region concurrently.

20. The method of claim 11, further comprising, implanting dopants of the first conductivity type in the second semiconductor material deposited in the well-tap region.

* * * * *